United States Patent
Lee et al.

(10) Patent No.: US 10,515,693 B1
(45) Date of Patent: Dec. 24, 2019

(54) DATA STORAGE APPARATUS AND OPERATING METHOD THEREOF

(71) Applicant: SK hynix Inc., Gyeonggi-do (KR)

(72) Inventors: Se Ho Lee, Gyeonggi-do (KR); Min Gu Kang, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/220,994

(22) Filed: Dec. 14, 2018

(30) Foreign Application Priority Data

Aug. 3, 2018 (KR) ........................ 10-2018-0090665

(51) Int. Cl.
*G11C 11/56* (2006.01)
*G06F 3/06* (2006.01)
*G06F 12/02* (2006.01)

(52) U.S. Cl.
CPC .......... *G11C 11/5635* (2013.01); *G06F 3/061* (2013.01); *G06F 3/0655* (2013.01); *G06F 3/0688* (2013.01); *G06F 12/0246* (2013.01); *G11C 2211/5641* (2013.01)

(58) Field of Classification Search
CPC .............................. G11C 8/10; G11C 16/0483
USPC ........................................ 365/185.01, 230.03
See application file for complete search history.

(56) References Cited

U.S. PATENT DOCUMENTS

| | | | | |
|---|---|---|---|---|
| 5,253,081 A * | 10/1993 | Shoji | ...................... | H04N 1/387 358/1.17 |
| 5,997,171 A * | 12/1999 | Talbott | ................ | H03M 7/3059 360/6 |
| 8,305,903 B1 * | 11/2012 | Louise | .................... | G06F 15/00 370/241 |
| 9,853,714 B2 * | 12/2017 | Bobrek | .............. | H04B 7/18506 |
| 10,324,510 B2 * | 6/2019 | Miyoshi | .................... | G06F 1/28 |
| 10,395,748 B2 * | 8/2019 | Shibata | .................. | G11C 29/44 |
| 2001/0017076 A1 * | 8/2001 | Fujita | ....................... | G10H 7/02 84/603 |
| 2002/0093439 A1 * | 7/2002 | Lundin | ............... | H03M 1/1038 341/120 |
| 2009/0003087 A1 * | 1/2009 | Doyle | ...................... | G11C 7/12 365/189.06 |
| 2015/0124982 A1 * | 5/2015 | Berthelsen | ........... | H04R 29/001 381/59 |

(Continued)

FOREIGN PATENT DOCUMENTS

KR 1020160087426 7/2016

*Primary Examiner* — Michael T Tran
(74) *Attorney, Agent, or Firm* — IP & T Group LLP

(57) ABSTRACT

A data storage apparatus includes a nonvolatile memory device including a first memory region and a second memory region and a controller configured to control a write operation of the nonvolatile memory device. The controller includes a memory configured to store at least one or more write requests and address information for the write requests received from a host apparatus and a processor configured to collect address information corresponding to a preset sampling range among the address information as a first sampling address, determine continuity between the collected address information of the first sampling address, and control the nonvolatile memory device to store data corresponding to all or a portion of the write requests for the address information of the first sampling address in the first memory region based on a determination result.

20 Claims, 8 Drawing Sheets

(56) References Cited

U.S. PATENT DOCUMENTS

| | | | |
|---|---|---|---|
| 2016/0187422 A1* | 6/2016 | Kumamoto | G09G 3/006 |
| | | | 714/727 |
| 2016/0351268 A1* | 12/2016 | Tran | G11C 16/30 |
| 2017/0185353 A1* | 6/2017 | Intrater | G06F 12/00 |
| 2017/0200505 A1* | 7/2017 | Jin | H05K 999/99 |
| 2017/0242583 A1* | 8/2017 | Yang | G06F 3/061 |
| 2018/0005690 A1* | 1/2018 | Morgan | G11C 11/40615 |
| 2018/0039448 A1* | 2/2018 | Harasawa | G06F 3/0659 |
| 2018/0061494 A1* | 3/2018 | Hwang | G06F 11/0706 |
| 2018/0129424 A1* | 5/2018 | Confalonieri | G06F 3/068 |
| 2018/0224293 A1* | 8/2018 | Xu | G01C 21/3446 |
| 2018/0261296 A1* | 9/2018 | Choi | G11C 29/021 |
| 2018/0337865 A1* | 11/2018 | Siddaiah | H04L 43/0852 |
| 2019/0115059 A1* | 4/2019 | Ware | G11C 5/04 |
| 2019/0166172 A1* | 5/2019 | Kurian | H04L 65/60 |
| 2019/0189214 A1* | 6/2019 | Tiwari | G11C 16/10 |

* cited by examiner

FIG.3
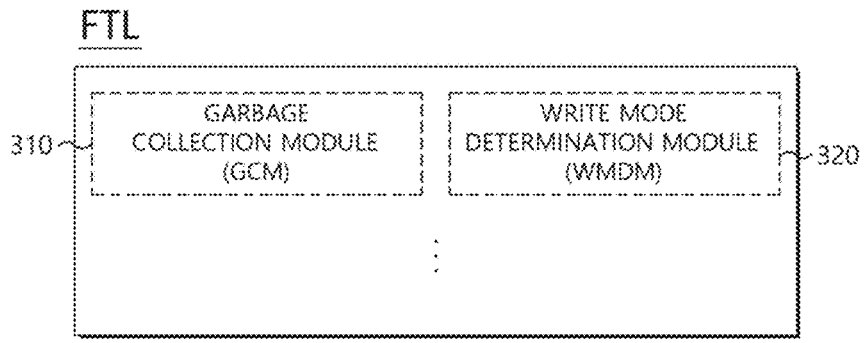
FIG.4
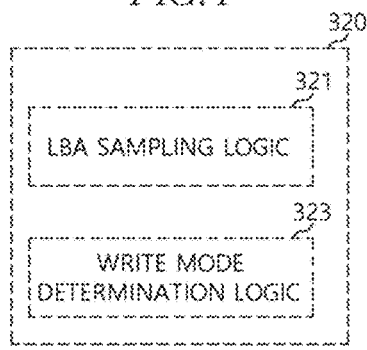
FIG.5
CMDQ
| CMD | Start LBA | Length |
|---|---|---|
| W1 | LBA0 | 100 |
| W2 | LBA100 | 100 |
| W3 | LBA200 | 100 |
| W4 | LBA1000 | 100 |
| W5 | LBA300 | 100 |
| ⋮ | ⋮ | ⋮ |
▢ Sequential LBAs
▨ Random LBAs

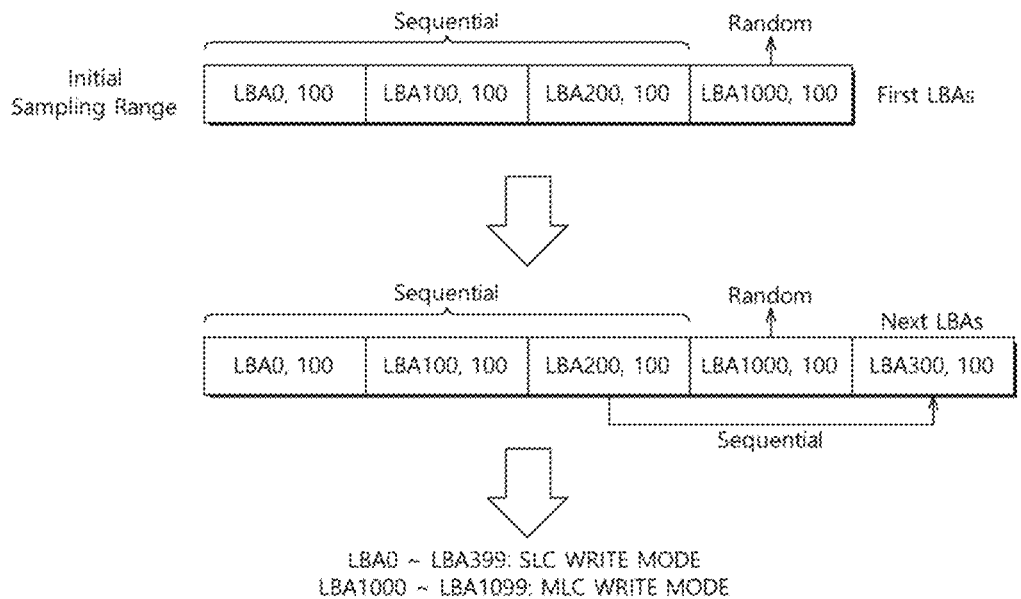
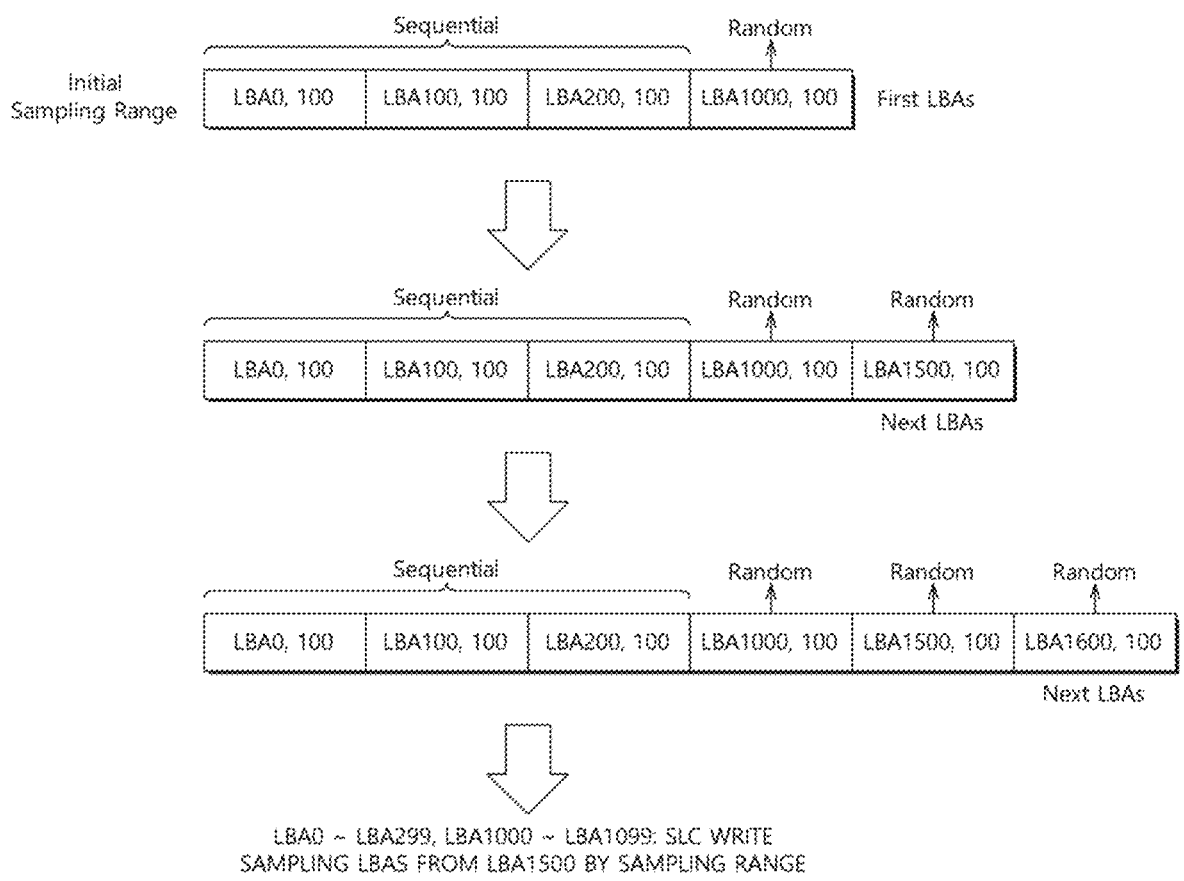

DATA STORAGE APPARATUS AND OPERATING METHOD THEREOF

CROSS-REFERENCES TO RELATED APPLICATION

The present application claims priority under 35 U.S.C. § 119(a) to Korean application number 10-2018-0090665 filed on Aug. 3, 2018, which is incorporated herein by reference in its entirety.

BACKGROUND

1. Technical Field

Various embodiments generally relate to a semiconductor apparatus and, more particularly, to a data storage apparatus and an operating method thereof.

2. Related Art

In recent years, the paradigm for computer environments changed to ubiquitous computing which may use computer systems every time everywhere. As a result, use of portable electronic apparatuses such as mobile phones, digital cameras, and laptop computers has been increasing rapidly. Generally, portable electronic apparatuses use data storage apparatuses that employ memory devices for storing data.

Data storage apparatuses using memory devices have no mechanical driving units and generally exhibit good stability and endurance, fast information access rate, and low power consumption. Such data storage apparatuses may include, for example, a universal serial bus (USB) memory device, a memory card having various interfaces, a universal flash storage (UFS) device, a solid-state drive (SSD), and the like.

SUMMARY

Various embodiments of the present invention are directed to a data storage apparatus capable of reducing and/or preventing degradation of read performance and an operating method thereof.

In an embodiment of the present disclosure, a data storage apparatus may include: a nonvolatile memory device including a first memory region and a second memory region; and a controller configured to control a write operation of the nonvolatile memory device. The controller may include: a memory configured to store at least one or more write requests and address information for the write requests received from a host apparatus; and a processor configured to collect address information corresponding to a preset sampling range among the address information as a first sampling address, determine continuity between the collected address information of the first sampling address, and control the nonvolatile memory device to store data corresponding to all or a portion of the write requests for the address information of the first sampling address in the first memory region based on a determination result.

In an embodiment of the present disclosure, an operating method of a data storage apparatus which includes a nonvolatile memory device including a first memory region and a second memory region; and a controller including a memory configured to store at least one or more write requests and address information for the write requests, the method may include: collecting address information corresponding to a preset sampling range among the address information as a first sampling address; determining continuity between the collected address information of the first sampling address; and storing data corresponding to all or a portion of the write requests for the address information of the first sampling address in the first memory region based on a determination result.

In an embodiment of the present disclosure, a data storage device may include: a memory device including a first memory region and a second memory region, a write speed of the first memory region faster than that of the second memory region; and a controller suitable for: receiving a plurality of data including a first group of data in a first range and a second group of data in a second range next to the first range; determining whether a first data among the second group of data is sequential to sequential data among the first group of data; when the first data is sequential to the sequential data, controlling the memory device to store the sequential data and the first data in the first memory region; and when the first data is not sequential to the sequential data, controlling the memory device to store the sequential data in the first memory region, and store the first data in the second memory region.

In accordance with embodiments, data corresponding to sequential logical block addresses and data corresponding to random logical block addresses may be separately stored in a first region and a second region of a memory device based on the continuity of the logical block addresses of the write commands.

Accordingly, the continuity of data transferred to the first region to the second region through a migration operation may be guaranteed and thus the degradation of read performance for the sequential data may be prevented.

These and other features, aspects, and embodiments are described below in the section entitled "DETAILED DESCRIPTION".

BRIEF DESCRIPTION OF THE DRAWINGS

The above and other aspects, features and advantages of the subject matter of the present disclosure will be more clearly understood from the following detailed description taken in conjunction with the accompanying drawings, in which:

FIG. 3 is a diagram illustrating a flash translation layer (FTL) in accordance with an embodiment of the present disclosure;

FIG. 4 is a diagram illustrating a configuration a write mode determination module of FIG. 3 in accordance with an embodiment of the present disclosure;

FIG. 5 is a diagram illustrating continuity of logical block addresses for write commands in accordance with an embodiment of the present disclosure;

FIG. 6 is a diagram illustrating an example that sequential logical block addresses among logical block addresses of a first sampling address and next logical block addresses are sequential in accordance with an embodiment of the present disclosure;

FIG. 7 is a diagram illustrating an example that sequential logical block addresses among logical block addresses of a first sampling address and next logical block addresses are not sequential in accordance with an embodiment of the present disclosure;

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the inventive concept.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Although a few embodiments of the present invention will be shown and described, it will be appreciated by those of ordinary skill in the art that changes may be made in these embodiments without departing from the principles and spirit of the present invention.

Figure 1:
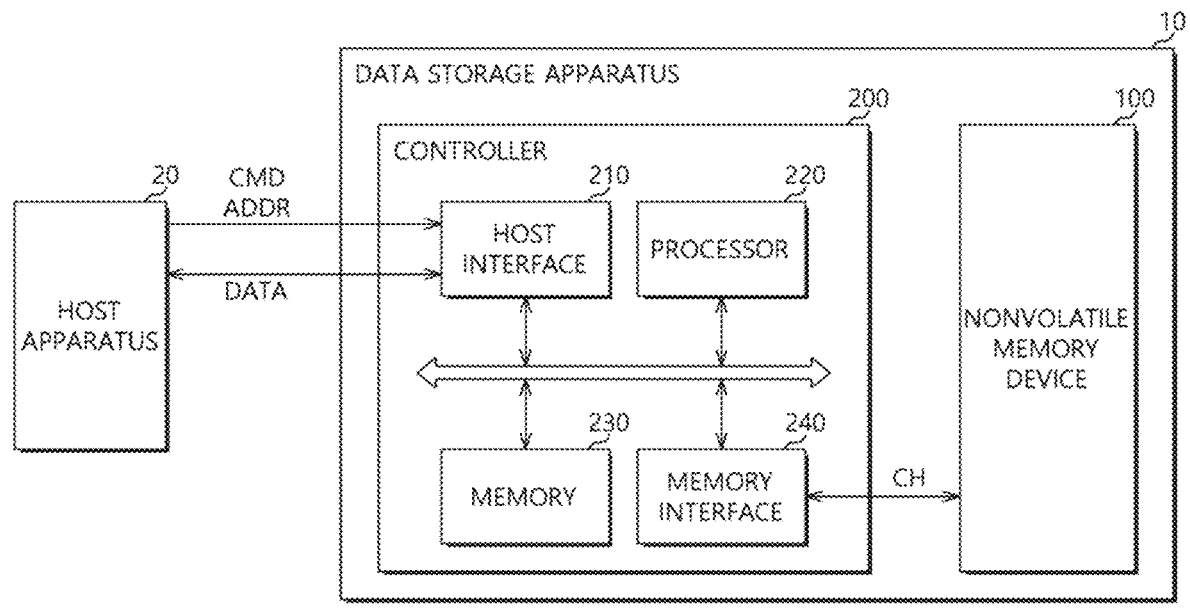
FIG. 1 is a block diagram illustrating a configuration of a data storage apparatus in accordance with an embodiment of the present disclosure.

FIG. 1 is a block diagram illustrating a configuration of a data storage apparatus 10 in accordance with an embodiment.

Referring to FIG. 1, the data storage apparatus 10 may store data to be accessed by a host apparatus 20 such as a mobile phone, an MP3 player, a laptop computer, a desktop computer, a game player, a television (TV), or an in-vehicle infotainment system, and the like. The data storage apparatus 10 may refer to a memory system.

The data storage apparatus 10 may be manufactured as any one among various types of storage apparatuses according to an interface protocol coupled to the host apparatus 20. For example, the data storage apparatus 10 may be configured as any one of various types of storage apparatuses, such as a solid-state drive (SSD), a multimedia card (e.g., an MMC, an eMMC, an RS-MMC, and a micro-MMC), a secure digital card (e.g., an SD, a mini-SD, and a micro-SD), a universal serial bus (USB) storage device, a universal flash storage (UFS) device, a personal computer memory card international association (PCMCIA) card type storage device, a peripheral component interconnection (PCI) card type storage device, a PCI-express (PCI-e or PCIe) card type storage device, a compact flash (CF) card, a smart media card, a memory stick, and the like.

The data storage apparatus 10 may be manufactured as any one among various types of packages. For example, the data storage apparatus 10 may be manufactured as any one of various types of packages, such as a package on package (PoP), a system in package (SiP), a system on chip (SoC), a multi-chip package (MCP), a chip on board (COB), a wafer-level fabricated package (WFP), and a wafer-level stack package (WSP).

The data storage apparatus 10 may include a nonvolatile memory device 100 and a controller 200.

The nonvolatile memory device 100 may be operated as a storage medium of the data storage apparatus 10. The nonvolatile memory device 100 may include any one of various types of nonvolatile memory devices according to a memory cell, such as a NAND flash memory device, a NOR flash memory device, a ferroelectric random-access memory (FRAM) using a ferroelectric capacitor, a magnetic random-access memory (MRAM) using a tunneling magneto-resistive (TMR) layer, a phase-change random-access memory (PRAM) using a chalcogenide alloy, and a resistive random-access memory (RERAM) using a transition metal compound.

For clarity, although the data storage apparatus 10 includes one nonvolatile memory device 100 in FIG. 1, the data storage apparatus 10 may include a plurality of nonvolatile memory devices and the present disclosure may be equally applied even to the data storage apparatus 10 including the plurality of nonvolatile memory device.

The nonvolatile memory device 100 may include a memory cell array (not shown) including a plurality of memory cells (not shown) arranged in regions in which a plurality of word lines (not shown) and a plurality of bit lines (not shown) cross each other. The memory cell array may include a plurality of memory blocks and each of the plurality of memory blocks may include a plurality of pages.

For example, each of the memory cells in the memory cell array may be at least one of a single level cell (SLC) in which a single bit data (for example, 1 bit of data) is to be stored and a multilevel cell (MLC) in which 2 or more bits of data are to be stored. The MLC may store 2 bits of data, 3 bits of data, 4 bits of data, and the like. In general, it is customary that a memory cell storing 2 bits of data is referred to as an MLC, a memory cell storing 3 bits of data is referred to as a triple level cell (TLC), and a memory cell storing 4 bits of data is referred to as a quad level cell (QLC). However, for clarity, the memory cells in which the 2 bits of data, the 3 bits of data, and the 4 bits of data are to be stored may collectively refer to the MLC in the present embodiment. Accordingly, the MLC to be described later may be a memory cell in which any one of the 2 bits of data, the 3 bits of data, and the 4 bits of data is to be stored.

The memory cell array may include at least one or more cells of the SLC and the MLC. For example, the memory cell array may include memory cells having a two-dimensional (2D) horizontal structure or memory cells having a three-dimensional (3D) vertical structure.

The controller 200 may control an overall operation of the data storage apparatus 10 through driving of firmware or software loaded into a memory 230. The controller 200 may decode and drive a code-type instruction or algorithm (for example, firmware or software). The controller 200 may be implemented in hardware or a combination of hardware and software.

The controller 200 may include a host interface 210, a processor 220, the memory 230, and a memory interface 240. Although not shown in FIG. 1, the controller 200 may further include an error correction code (ECC) engine configured to generate a parity error correction operation by ECC-encoding write data provided from the host apparatus 20 and ECC-decoding read data read out from the nonvolatile memory device 100 using a parity.

The host interface 210 may perform interfacing between the host apparatus 20 and the data storage apparatus 10 according to a protocol of the host apparatus 20. For example, the host interface 210 may communicate with the host apparatus 20 through any one among a universal serial bus (USB) protocol, a universal flash storage (UFS) protocol, a multimedia card (MMC) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, and a PCI express (PCI-e or PCIe) protocol.

For example, the processor 220 may be configured as a micro control unit (MCU) and/or a central processing unit (CPU). The processor 220 may process a request received from the host apparatus 20. To process the request received from the host apparatus 20, the processor 220 may drive a code-type instruction or an algorithm (for example, firmware) loaded into the memory 230 and control internal function blocks such as the host interface 210, the memory 230, and the memory interface 240 and the nonvolatile memory device 100.

The processor 220 may generate control signals for controlling an operation of the nonvolatile memory device 100 based on the requests received from the host apparatus 20 and provide the generated control signals to the nonvolatile memory device 100 through the memory interface 240.

The memory 230 may be configured as a random-access memory such as a dynamic RAM (DRAM) or a static RAM (SRAM).

The memory 230 may store firmware driven through the processor 220. The memory 230 may store data (for example, meta data) required for driving of the firmware. For example, the memory 230 may be operated as a working memory of the processor 220.

The memory 230 may be configured to include a data buffer which temporarily stores write data to be transmitted from the host apparatus 20 to the nonvolatile memory device 100 or read data to be transmitted from the nonvolatile memory device 100 to the host apparatus 20. For example, the memory 230 may be operated as a buffer memory.

The memory interface 240 may control the nonvolatile memory device 100 according to control of the processor 220. The memory interface 240 may refer to a memory controller. The memory interface 240 may provide control signals to the nonvolatile memory device 100. The control signals may include a command, an address, an operation control signal, and the like for controlling the nonvolatile memory device 100. The memory interface 240 may provide data stored in the data buffer to the nonvolatile memory device 100 or store data transmitted from the nonvolatile memory device 100 in the data buffer.

Figure 2:
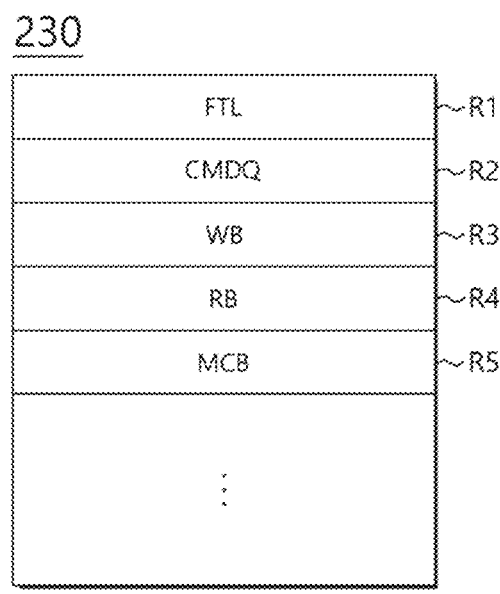
FIG. 2 is a diagram illustrating a configuration of a memory of FIG. 1.

FIG. 2 is a diagram illustrating an exemplary configuration of the memory 230 of FIG. 1.

Referring to FIG. 2, the memory 230 may include a first region R1, a second region R2, a third region R3, a fourth region R4 and a fifth region R5. In the first region R1, a flash translation layer FTL is to be stored. The second region R2 may be used as a command queue CMDQ for queuing a command corresponding to a request provided from the host apparatus 20. The third region R3 may be used as a write data buffer WB in which write data is to be temporarily stored. The fourth region R4 may be used as a read data buffer RB in which read data is to be temporarily stored. The fifth region R5 may be used as a map cache buffer MCB in which map data is to be cached. It will be obvious to those skilled in the art that the memory 230 may include more regions used for various purposes in addition to the above-described regions.

Referring again to FIG. 1, when the nonvolatile memory device 100 is a flash memory device, the processor 220 may control an intrinsic operation of the nonvolatile memory device 100 and drive software which known as a flash translation layer FTL to provide device compatibility to the host apparatus 20. Through the driving of the flash translation layer FTL, the host apparatus 20 may use the data storage apparatus 10 by recognizing the data storage apparatus 10 as a general data storage apparatus such as a hard disc.

Referring again to FIG. 2, the flash translation layer FTL stored in the first region R1 of the memory 230 may include modules configured to perform various functions and meta data required for driving of the modules. The flash translation layer FTL may be stored in a system region (not shown) of the nonvolatile memory device 100. The flash translation layer FTL may be read out from the system region of the nonvolatile memory device 100 and loaded into the first region R1 of the memory 230 when the data storage apparatus 10 is powered on.

FIG. 3 is a diagram illustrating a flash translation layer FTL in accordance with an embodiment.

Referring to FIG. 3, the flash translation layer FTL may include, but not limited to, a garbage collection module (GCM) 310, and a write mode determination module (WMDM) 320. The flash translation layer FTL may further include a wear-leveling module, a bad block management module, an address map, a write module, a read module, and a map module.

The garbage collection module (GCM) 310 may manage the nonvolatile memory device 100 and the memory 230 to perform an operation which transfers valid data stored in a memory block of the nonvolatile memory device 100 to a target memory block.

When the nonvolatile memory device 100 is a flash memory device, then it does not support data overwrite due to the structural organization of a flash memory device. Hence, when data is written in a memory cell in which data has been stored again, for example, when the data is written in the memory cell of a programmed state again, the reliability of the data stored in the corresponding memory cell may not be guaranteed. Accordingly, an erase operation on the memory cell of the programmed state may be inevitably preferentially performed to write the data in the memory cell of the programmed state.

Since the erase operation on the nonvolatile memory device 100 is performed in memory block units, a considerably longer period of time may be required for the erase operation. For this reason, when a memory cell corresponding to an address to be written is in a programmed state, the processor 220 may not perform an operation of erasing data in the corresponding memory cell and then programming data in the memory cell but may perform an operation of programming data in another memory cell which has been already in an erase state. In this case, the data stored in the memory cell in which data is to be originally written may be invalid data as old data and the data stored in the other memory cell may be valid data as the latest data.

Through such an operation of the processor 220, the valid data and invalid data may be mixed in the memory block of the nonvolatile memory device 100. When the number of free blocks included in the nonvolatile memory device 100 is equal to or less than a threshold value, the processor 220 may perform, through the driving of the garbage collection module (GCM) 310, a series of operations for selecting a victim block among a plurality of memory blocks and for allowing the victim block to be the free block by transferring valid data included in the victim block to a target block. The series of operations are referred to also as a garbage collection operation. The free block may refer to a usable memory block.

The write mode determination module (WMDM) 320 may determine continuity between the logical block addresses LBAs for write requests received from the host apparatus 20. The write mode determination module (WMDM) 320 may control the nonvolatile memory device 100 to store write data corresponding to the sequential logical block addresses LBAs in the first region of the nonvolatile memory device 100 and to store write data corresponding to the random logical block addresses LBAs in the second region of the nonvolatile memory device 100.

As described above, the nonvolatile memory device 100 may include a plurality of memory blocks (not shown). Some memory blocks among the plurality of memory blocks may be used as the first region and the remaining memory blocks may be used as the second memory region. The memory blocks (hereinafter, referred to as 'first memory blocks') used as the first region may include the single level cells (SLCs) which store 1-bit data. The memory blocks (hereinafter, referred to as 'second memory blocks') used as the second region may include the multilevel cells (MLCs) which store 2 or more bits of data.

The amount of data stored in the second memory block may be greater than that of data stored in the first memory block. A time required for storing data in the second memory block may be greater than that required for storing data in the first memory block. For this reason, the processor 220 may control the nonvolatile memory device 100 to preferentially store user data, which is write-requested from the host apparatus 20, fast in the first memory block and to allow the user data stored in the first memory block to migrate to the second memory block during an idle time of the data storage apparatus 10.

In other words, the processor 220 may store the user data in the first memory block having relatively fast write operation speed and then transfer the user data stored in the first memory block to the second memory block during the idle time. Accordingly, the data storage apparatus 10 may provide a faster write operation to the user.

The write data provided to the data storage apparatus 10 from the host apparatus 20 may include the user data and meta data for managing the user data. For example, the meta data may include position information and size information of the user data, but this is not limited thereto.

The host apparatus 20 may generate the meta data for the user data input from the user and provide the generated meta data to the data storage apparatus 10 together with the user data. The host apparatus 20 may separately allocate the logical block addresses for the user data and the logical block addresses for the meta data and provide the user data and the meta data corresponding thereto to the data storage apparatus 10 as one chunk of write data. That is, each of a plurality of write data chunks received from the host apparatus may include user data and meta data.

Accordingly, even though the sequential user data are inputted to the host apparatus 20 from the user, the write data transmitted from the host apparatus 20 to the data storage apparatus 10 may be in a mixed form of the user data and the meta data. Thus, the logical block addresses for the write data may not be sequential. For example, the logical block addresses LBAs for the user data may be sequential, but the logical block addresses LBAs for the user data and the meta data may not be sequential.

The write data may be stored in the first memory block in a mixed form of the user data and the meta data. Then, the write data may be migrated to the second memory block in the same form, for example, in the mixed form of the user data and the meta data. Accordingly, the data storage apparatus 10 may not provide sequential read performance but may provide random read performance in response to the read request for the user data stored in the second memory block. Thus, the read performance may be degraded.

The write mode determination module (WMDM) 320 may confirm the logical block addresses LBAs for the write requests received from the host apparatus 20, separate the logical block addresses according to their continuity, and store data corresponding to the separated logical block addresses in the first memory block and the second memory block.

FIG. 4 is a diagram illustrating a write mode determination module (WMDM) in accordance with an embodiment, for example, the write mode determination module (WMDM) 320 of FIG. 3. FIG. 5 is a diagram illustrating continuity of the logical block addresses LBAs for write commands in accordance with an embodiment.

Referring to FIG. 4, the write mode determination module (WMDM) 320 may include a logical block address (LBA) sampling logic 321 and a write mode determination logic 323.

The LBA sampling logic 321 may check address information for at least one or more write commands queued in the command queue CMDQ of the memory 230 and determine whether or not the addresses for the write commands are sequential. In various embodiments, as shown in FIG. 5, each of the address information may include a start logical block address (Start LBA) and an address length (Length), but this is not limited thereto.

The LBA sampling logic 321 may not determine whether or not the logical block addresses LBAs are sequential until the logical block addresses LBAs having a size (or length) corresponding to a preset sampling range are collected. For example, the LBA sampling logic 321 may determine whether or not the logical block addresses LBAs corresponding to the write commands are sequential when the s1 sum of the sizes (or lengths) of the logical block addresses LBAs of the write commands queued in the command queue CMDQ become the preset sampling range.

The preset sampling range may correspond to a size of data which is to be stored through one write operation, but this is not limited thereto. The size of the data to be stored through one write operation may be a size corresponding to a page of a memory block or a size corresponding to a portion of the page of the memory block, but this is not limited thereto. For clarity, it is assumed that the preset sampling range in the embodiment is the data size corresponding to the address length of '400'.

The LBA sampling logic 321 may determine whether or not first to fourth logical block addresses LBA0~LBA99, LBA100~LBA199, LBA200~LBA299, and LBA1000~LBA1099 for first to fourth write commands W1 to W4 illustrated in FIG. 5 are sequential. For example, the LBA sampling logic 321 may determine that the first to third logical block addresses LBA0~LBA99, LBA100~LBA199, and LBA200~LBA299 are sequential and the third and fourth logical block addresses LBA200~LBA299 and LBA1000~LBA1099 are not sequential.

The LBA sampling logic 321 may compare the sum of the start logical block address Start LBA and the address length included in the address information for each write command with the start logic block address Start LBA of the next write command. The LBA sampling logic 321 may determine that the logical block addresses are sequential when the sum is equal to the start logical block address Start LBA. The LBA sampling logic 321 may determine that the logical block addresses are not sequential when the sum is not equal to the start logical block addresses Start LBA. However, the method for determining the continuity of the logical block addresses LBAs through the LBA sampling logic 321 in accordance with the embodiment is not limited thereto.

Since the partial logical block addresses LBAs within the preset sampling range are not sequential, the LBA sampling logic 321 may determine whether or not fifth logical block addresses LBA300~LBA399 for the next write command (for example, fifth write command) and the third logical block addresses LBA200~LBA299 are sequential. As illustrated in FIG. 5, the sum of the start logical block address LBA200 and the address length 100 of the third logical block addresses LBA200~LBA299 is equal to the start logical block address LBA300 of the fifth logical block addresses LBA300~LBA399. Thus, the LBA sampling logic 321 may determine that the first to third logical block addresses and the fourth logical block addresses LBA0~LBA399 are sequential and the fourth logical block addresses LBA1000~LBA1099 are random.

The write mode determination logic 323 may determine that the data corresponding to the logical block addresses LBAs, which are determined to be sequential through the LBA sampling logic 321, are to be stored in an SLC mode in the first memory block and the data corresponding to the logical block addresses LBAs, which are determined to be random through the LBA sampling logic 321, are to be stored in the MLC mode in the second memory block. Further, the write mode determination logic 323 may determine that the data corresponding to all the logical block addresses LBAs, which are determined to be random through the LBA sampling logic 321, are to be stored in the SLC mode in the first memory block.

The write mode determination logic 323 may output a write control signal indicating the determined write mode (e.g., SLC mode or MLC mode). The processor 220 may control the nonvolatile memory device 100 to be operated in the corresponding write mode according to the received write control signal.

FIG. 6 is a diagram illustrating an example that sequential logical block addresses among logical block addresses of a first sampling address First LBAs and next logical block addresses Next LBAs are sequential, in accordance with an embodiment. FIG. 7 is a diagram illustrating an example that sequential logical block addresses among logical block addresses of a first sampling address First LBAs and next logical block addresses Next LBAs are not sequential in accordance with an embodiment.

Referring to FIG. 6, the third logical block addresses LBA200~LBA299 and the fourth logical block addresses LBA1000~LBA1099 among the logical block addresses of the first sampling address First LBAs corresponding to an initial sampling range may not be sequential. Here, the first sampling address First LBAs (also referred to in FIG. 6 as the initial sampling range) refers to the logical block addresses LBAs collected according to the preset sampling range. Accordingly, the LBA sampling logic 321 of FIG. 4 may determine whether or not the next logical block addresses Next LBAs LBA300~LBA399 corresponding to the next write command and the third logical block addresses LBA200~LBA299 are sequential by determining the continuity between the next logical block addresses Next LBAs LBA300~LBA399 and the third logical block addresses LBA200~LBA299. As illustrated in FIG. 6, the third logical block addresses LBA200~LBA299 and the next logical block addresses Next LBAs are sequential. Thus, the write mode determination logic 323 may output the write control signal indicating the SLC write mode in relation to the write commands corresponding to the logical block addresses LBA0~LBA399 included in the sampling range. Further, the write mode determination logic 323 may output the write control signal indicating the MLC write mode in relation to the write command corresponding to the random fourth logical block addresses LBA1000~LBA1099 among the logical block addresses of the first sampling address First LBAs.

Referring to FIG. 7, an example is shown where the third logical block addresses LBA200~LBA299 among the logical block addresses of the first sampling address First LBAs and the next logical block addresses Next LBAs LBA1500~LBA1599 are not be sequential. Also, the third logical block addresses LBA200~LBA299 among the logical block addresses of the first sampling address First LBAs and the next to the next logical block addresses Next LBAs LBA1600~LBA1699 are not sequential.

In this case, the write mode determination logic 323 of FIG. 4 outputs the write control signal indicating the SLC write mode in relation to the write commands corresponding to the logical block addresses LBA0~LBA299 and LBA1000~LBA1099 of the first sampling address First LBAs which are not sequential. Further, the LBA sampling logic 321 may then sequentially collect logical block addresses from address information including 'LBA1500, 100' as the start logical block address Start LBA and the address length by the sampling range. The LBA sampling logic 321 may determine whether or not the collected logical block addresses are sequential by determining the continuity between the collected logical block addresses.

Figure 8:
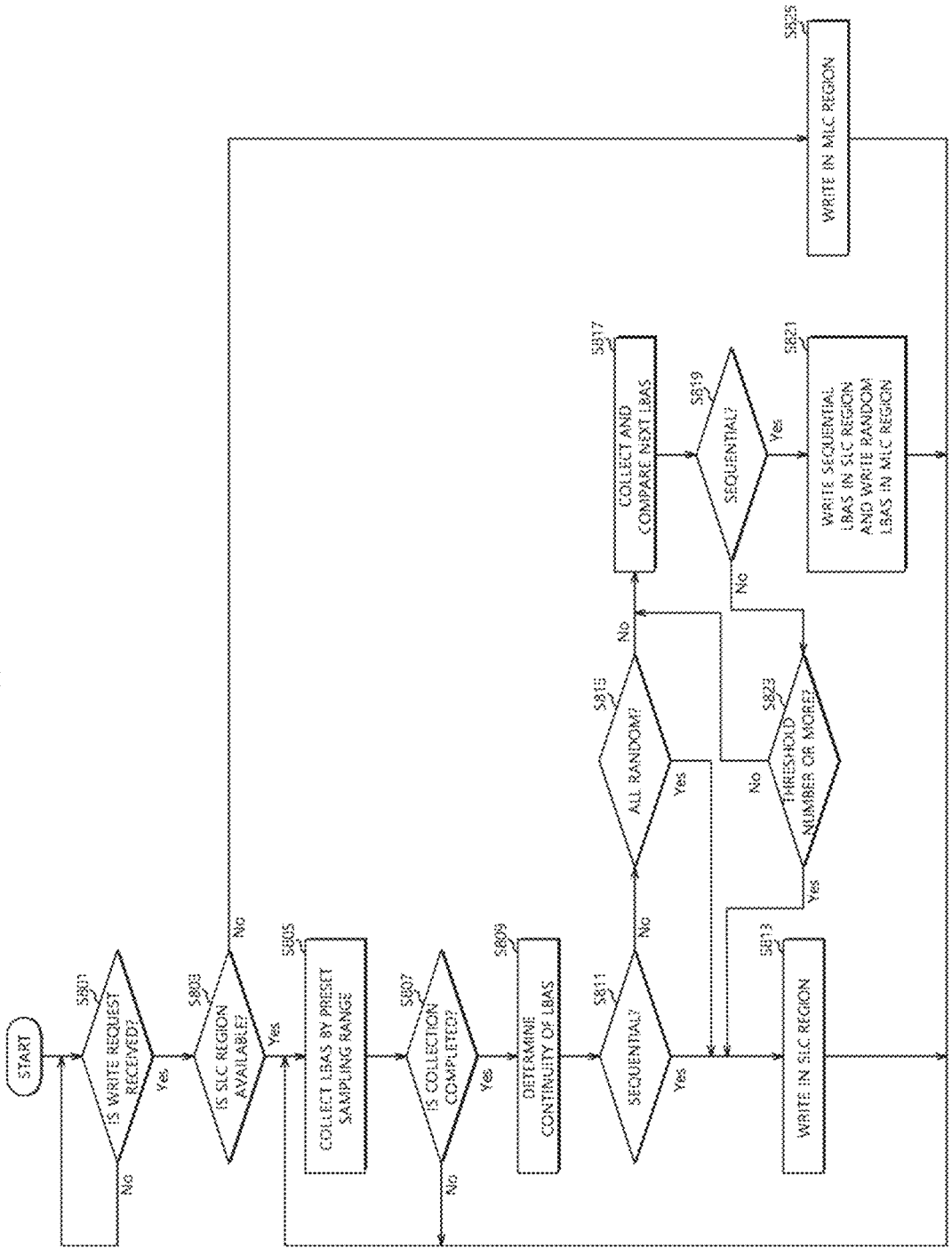
FIG. 8 is a flowchart of an operation method of a data storage apparatus in accordance with an embodiment of the present disclosure.

FIG. 8 is a flowchart of an operation method of a data storage apparatus 10 in accordance with an embodiment. The operation method of FIG. 8 will be described with reference to any one or more drawings of FIG. 1 to FIG. 7.

Referring to FIG. 8, in operation S801, the processor 220 of the controller 200 may determine whether or not a write request is received from the host apparatus 20. When the write request is to received ("Yes") from the host apparatus 20, the processor 220 may proceed to operation S803.

In operation S803, the processor 220 may determine whether or not the first region (for example, SLC region) of the nonvolatile memory device 100 is available. The processor 220 may proceed to operation S805 when the first region is available (S803, Yes) and proceed to operation S825 when the first region is not available (S803, No).

In operation S805, the processor 220 may collect logical block addresses LBAs to be sampled by driving the write mode determination module (WMDM) 320. The write mode determination module (WMDM) 320 may collect the logical block addresses LBAs until the sum of the sizes (or lengths) of the logical block addresses LBAs become the preset sampling range. Here, the logical block addresses LBAs may be logical block addresses corresponding to the address information received from the host apparatus 20 together with the write requests.

In operation S807, the write mode determination module 320 may determine whether or not the logical block addresses LBAs are collected according to the preset sampling range. When the logical block addresses LBAs are collected according to the preset sampling range (S807, Yes), the processor 220 may proceed to operation S809. For clarity, the logical block addresses LBAs collected according to the preset sampling range may refer to the first sampling address LBAs.

In operation 809, the write mode determination module 320 may determine continuity of the logical block addresses LBAs of the first sampling address. For example, the write mode determination module 320 may determine the continuity of the logical block addresses LBAs of the first sampling address by a comparison operation. The comparison operation may include comparing whether or not the sum of a start logical block address and an address length of address information for each write request received from the host apparatus 20 is equal to a start logical block address of the address information for the next write request.

In operation S811, the write mode determination module 320 may determine whether or not the logical block addresses LBAs of the first sampling address are sequential. The processor 220 may proceed to operation S813 when the logical block addresses LBAs of the first sampling address are sequential (S811, Yes). The processor 220 may proceed to operation S815 when the logical block addresses LBAs of the first sampling address are not sequential (S811, No).

In operation S813, the write mode determination module 320 may determine to perform the write operations in the SLC mode on the first region of the nonvolatile memory device 100 in response to the write requests corresponding to the logical block addresses LBAs of the first sampling address. Then, the write mode determination module 320 may output a write control signal indicating the determined write mode (for example, SLC mode). The processor 220 may control the nonvolatile memory device 100 to perform the write operations in the SLC mode for the write requests corresponding to the logical block addresses LBAs of the first sampling address according to the write control signal output from the write mode determination module 320.

In operation S815, the write mode determination module 320 s1 may determine whether or not all the logical block addresses LBAs of the first sampling address are random. The write mode determination module 320 may proceed to operation S813 when all the logical block addresses LBAs of the first sampling address are random (S815, Yes). The write mode determination module 320 may proceed to operation S817 when all the logical block addresses LBAs of the first sampling address are not random (S815, No).

In operation 817, the write mode determination module 320 may collect next logical block addresses LBAs by partial logical block addresses LBAs which are not sequential among the logical block addresses LBAs of the first sampling address. Then, the write mode determination module 320 may determine the continuity between sequential logical block addresses among the logical block addresses LBAs of the first sampling address and the collected next logical block addresses.

In operation S819, the write mode determination module 320 may determine whether or not the sequential logical block addresses among the logical block addresses of the first sampling address and the collected next logical block addresses are sequential according to the determined continuity. The write mode determination module 320 may proceed to operation S821 when the logical block addresses are sequential (S819, Yes). The write mode determination module 320 may proceed to operation S823 when the logical block addresses are not sequential (S819, No).

In operation S821, the write mode determination module 320 may determine to perform the write operations in the SLC mode on the first region of the nonvolatile memory device 100 in response to the write requests corresponding to the sequential logical block addresses among the logical block addresses LBAs of the first sampling address and the collected next logical block addresses. Then, the write mode determination module 320 may output the write control signal indicating the determined write mode (for example, SLC mode). Further, the write mode determination module 320 may determine to perform the write operations in the MLC mode on the second region of the nonvolatile memory device 100 in response to write requests corresponding to the non-sequential logical block addresses LBAs among the logical block addresses LBAs of the first sampling address. Then, the write mode determination module 320 may output the write control signal indicating the determined write mode (for example, MLC mode).

In operation S823, the write mode determination module 320 may determine whether or not the number of times the process of collecting and determining is performed is greater than a preset threshold number. The process of collecting and determining may include collecting next logical block addresses LBAs and determining the continuity between the sequential logical block addresses among the logical block addresses of the first sampling address and the collected next logical block addresses. The write mode determination module 320 may proceed to operation 813 when the number of times the process is performed is greater than the threshold number (S823, Yes). The write mode determination module 320 may proceed to operation S817 when the number of times the process is performed is not greater than the threshold number (S823, No).

In operation S825, the processor 220 may control the nonvolatile memory device 100 to store data in the second region (for example, MLC region) of the nonvolatile memory device 100 in response to the write requests received from the host apparatus 20 as the first region of the nonvolatile memory device 100 is not available.

Figure 9:
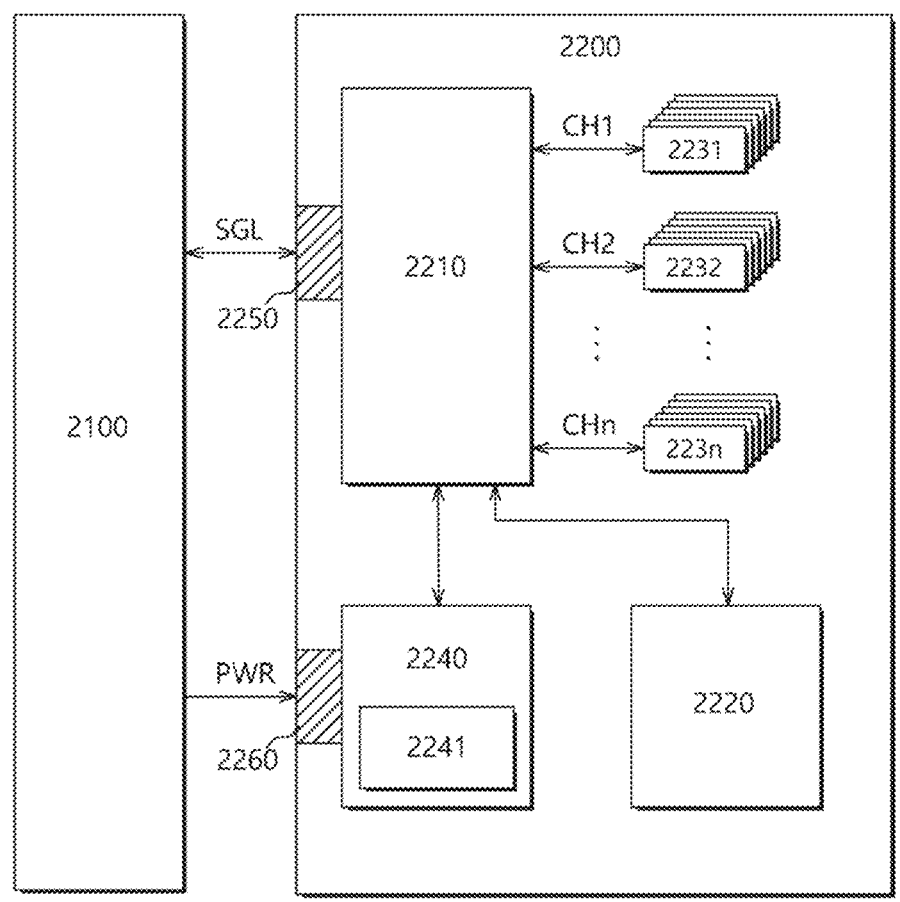
FIG. 9 is a diagram illustrating a data processing system including a solid-state drive (SSD) in accordance with an embodiment of the present disclosure.

FIG. 9 is a diagram illustrating a data processing system 2000 including a solid-state drive (SSD) 2200 in accordance with an embodiment. Referring to FIG. 9, the data processing system 2000 may include a host apparatus 2100 and the SSD 2200.

The SSD 2200 may include a controller 2210, a buffer memory device 2220, nonvolatile memory devices 2231 to 223n, a power supply 2240, a signal connector 2250, and a power connector 2260.

The controller 2210 may control an overall operation of the SSD 2220.

The buffer memory device 2220 may temporarily store data to be stored in the nonvolatile memory devices 2231 to 223n. The buffer memory device 2220 may temporarily store data read from the nonvolatile memory devices 2231 to 223n. The data temporarily stored in the buffer memory device 2220 may be transmitted to the host apparatus 2100 or the nonvolatile memory devices 2231 to 223n according to control of the controller 2210.

The nonvolatile memory devices 2231 to 223n may be used as a storage medium of the SSD 2200. The nonvolatile memory devices 2231 to 223n may be coupled to the controller 2210 through a plurality of channels CH1 to CHn. One or more nonvolatile memory devices may be coupled to one channel. The nonvolatile memory devices coupled to the one channel may be coupled to the same signal bus and the same data bus.

The power supply 2240 may provide power PWR input through the power connector 2260 to the inside of the SSD 2200. The power supply 2240 may include an auxiliary power supply 2241. The auxiliary power supply 2241 may supply the power so that the SSD 2200 is normally terminated even when sudden power-off occurs. The auxiliary power supply 2241 may include large capacity capacitors capable of charging the power PWR.

The controller 2210 may exchange a signal SGL with the host apparatus 2100 through the signal connector 2250. The signal SGL may include a command, an address, data, and the like. The signal connector 2250 may be configured of various types of connectors according to an interfacing method between the host apparatus 2100 and the SSD 2200.

Figure 10:
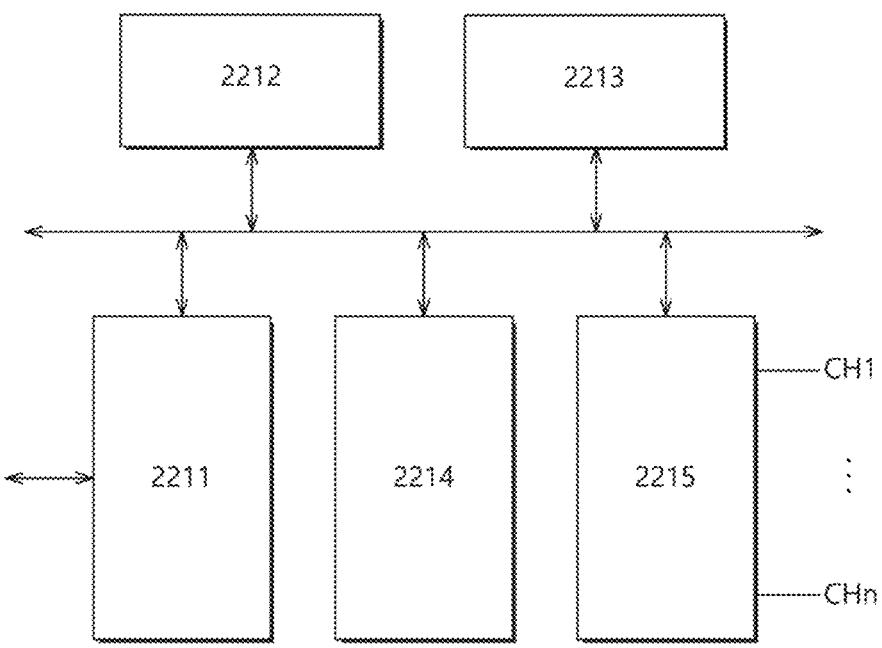
FIG. 10 is a diagram illustrating a configuration of a controller illustrated in FIG. 9 in accordance with an embodiment of the present disclosure.

FIG. 10 is a diagram illustrating a controller in accordance with an embodiment of the present disclosure, for example, the controller 2210 of FIG. 9. Referring to FIG. 10, the controller 2210 may include a host interface unit 2211, a control unit 2212, a random-access memory (RAM) 2213, an error correction code (ECC) unit 2214, and a memory interface unit 2215.

The host interface unit 2211 may perform interfacing between the host apparatus 2100 and the SSD 2200 according to a protocol of the host apparatus 2100. For example, the host interface unit 2211 may communicate with the host apparatus 2100 through any one among a secure digital protocol, a universal serial bus (USB) protocol, a multimedia card (MMC) protocol, an embedded MMC (eMMC) protocol, a personal computer memory card international association (PCMCIA) protocol, a parallel advanced technology attachment (PATA) protocol, a serial advanced technology attachment (SATA) protocol, a small computer system interface (SCSI) protocol, a serial attached SCSI (SAS) protocol, a peripheral component interconnection (PCI) protocol, a PCI Express (PCI-e or PCIe) protocol, and a universal flash storage (UFS) protocol. The host interface unit 2211 may perform a disc emulation function that the host apparatus 2100 recognizes the SSD 2200 as a general-purpose data storage apparatus, for example, a hard disc drive HDD.

The control unit 2212 may analyze and process the signal SGL input from the host apparatus 2100. The control unit 2212 may control operations of internal functional blocks according to firmware and/or software for driving the SDD 2200. The RAM 2213 may be operated as a working memory for driving the firmware or software.

The ECC unit 2214 may generate parity data for the data to be transferred to the nonvolatile memory devices 2231 to 223n. The generated parity data may be stored in the nonvolatile memory devices 2231 to 223n together with the data. The ECC unit 2214 may detect errors for data read from the nonvolatile memory devices 2231 to 223n based on the parity data. When detected errors are within a correctable range, the ECC unit 2214 may correct the detected errors.

The memory interface unit 2215 may provide a control signal such as a command and an address to the nonvolatile memory devices 2231 to 223n according to control of the control unit 2212.

The memory interface unit 2215 may exchange data with the nonvolatile memory devices 2231 to 223n according to control of the control unit 2212. For example, the memory interface unit 2215 may provide data stored in the buffer memory device 2220 to the nonvolatile memory devices 2231 to 223n or provide data read from the nonvolatile memory devices 2231 to 223n to the buffer memory device 2220.

Figure 11:
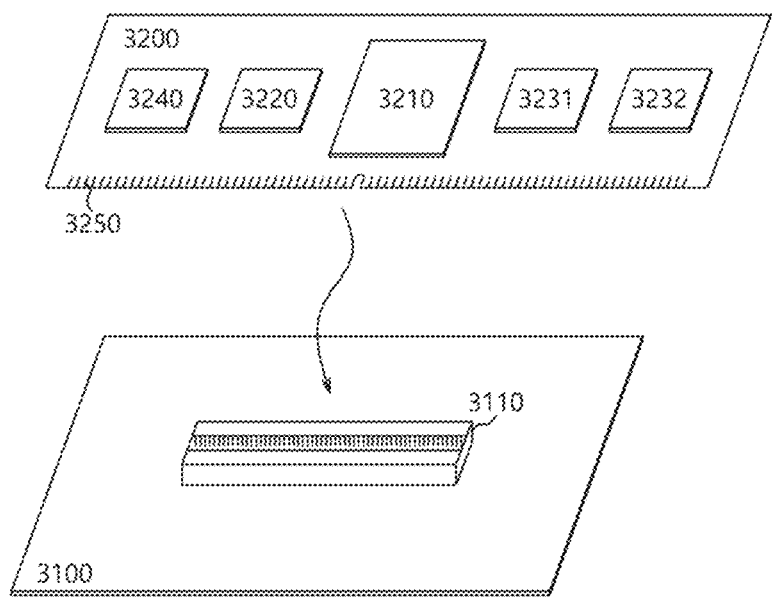
FIG. 11 is a diagram illustrating a data processing system including a data storage apparatus in accordance with an embodiment of the present disclosure.

FIG. 11 is a diagram illustrating a data processing system 3000 including a data storage apparatus 3200 in accordance with an embodiment. Referring to FIG. 11, the data processing system 3000 may include a host apparatus 3100 and the data storage apparatus 3200.

The host apparatus 3100 may be configured in a board form such as a printed circuit board (PCB). Although not shown in FIG. 11, the host apparatus 3100 may include internal functional blocks configured to perform functions of the host apparatus 3100.

The host apparatus 3100 may include a connection terminal 3110 such as a socket, a slot, or a connector. The data storage apparatus 3200 may be mounted on the connection terminal 3110.

The data storage apparatus 3200 may be configured in a board form such as a PCB. The data storage apparatus 3200 may refer to a memory module or a memory card. The data storage apparatus 3200 may include a controller 3210, a buffer memory device 3220, nonvolatile memory devices 3231 to 3232, a power management integrated circuit (PMIC) 3240, and a connection terminal 3250.

The controller 3210 may control an overall operation of the data storage apparatus 3200. The controller 3210 may be configured to have the same configuration as the controller 2210 illustrated in FIG. 10.

The buffer memory device 3220 may temporarily store data be stored in the nonvolatile memory devices 3231 and 3232. The buffer memory device 3220 may temporarily store data read from the nonvolatile memory devices 3231 and 3232. The data temporarily stored in the buffer memory device 3220 may be transmitted to the host apparatus 3100 or the nonvolatile memory devices 3231 and 3232 according to control of the controller 3210.

The nonvolatile memory devices 3231 and 3232 may be used as a storage medium of the data storage apparatus 3200.

The PMIC 3240 may provide power input through the connection terminal 3250 to the inside of the data storage apparatus 3200. The PMIC 3240 may manage the power of the data storage apparatus 3200 according to control of the controller 3210.

The connection terminal 3250 may be coupled to the connection terminal 3110 of the host apparatus 3100. A signal such as a command, an address, and data and power may be transmitted between the host apparatus 3100 and the data storage apparatus 3200 through the connection terminal 3250. The connection terminal 3250 may be configured in various forms according to an interfacing method between the host apparatus 3100 and the data storage apparatus 3200. The connection terminal 3250 may be arranged in any one side of the data storage apparatus 3200.

Figure 12:
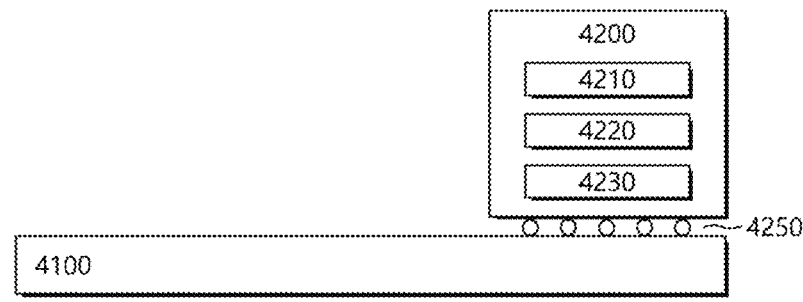
FIG. 12 is a diagram illustrating a data processing system including a data storage apparatus in accordance with an embodiment of the present disclosure.

FIG. 12 is a diagram illustrating a data processing system 4000 including a data storage apparatus 4200 in accordance with an embodiment. Referring to FIG. 12, the data processing system 4000 may include a host apparatus 4100 and the data storage apparatus 4200.

The host apparatus 4100 may be configured in a board form such as a printed circuit board (PCB). Although not shown in FIG. 12, the host apparatus 4100 may include internal functional blocks configured to perform functions of the host apparatus 4100.

The data storage apparatus 4200 may be configured in a surface mounting packaging form. The data storage apparatus 4200 may be mounted on the host apparatus 4100 through a solder ball 4250. The data storage apparatus 4200 may include a controller 4210, a buffer memory device 4220, and a nonvolatile memory device 4230.

The controller 4210 may control an overall operation of the data storage apparatus 4200. The controller 4210 may be configured to have the same configuration as the controller 2210 illustrated in FIG. 10.

The buffer memory device 4220 may temporarily store data to be stored in the nonvolatile memory device 4230. The buffer memory device 4220 may temporarily store data read from the nonvolatile memory device 4230. The data temporarily stored in the buffer memory device 4220 may be transmitted to the host apparatus 4100 or the nonvolatile memory device 4230 through control of the controller 4210.

The nonvolatile memory device 4230 may be used as a storage medium of the data storage apparatus 4200.

Figure 13:
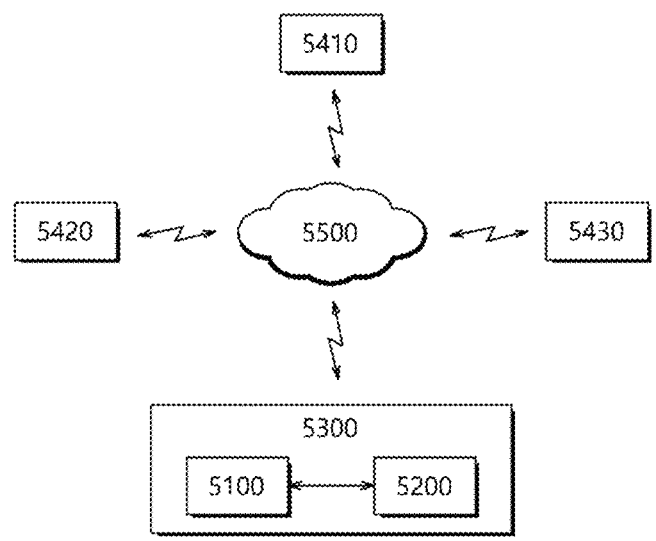
FIG. 13 is a diagram illustrating a network system including a data storage apparatus in accordance with an embodiment of the present disclosure.

FIG. 13 is a diagram illustrating a network system 5000 including a data storage apparatus in accordance with an embodiment. Referring to FIG. 13, the network system 5000 may include a server system 5300 and a plurality of client systems 5410 to 5430 which are coupled through a network 5500.

The server system 5300 may serve data in response to requests of the plurality of client systems 5410 to 5430. For example, the server system 5300 may store data provided from the plurality of client systems 5410 to 5430. In another example, the server system 5300 may provide data to the plurality of client systems 5410 to 5430.

The server system 5300 may include a host apparatus 5100 and a data storage apparatus 5200. The data storage apparatus 5200 may be configured of the data storage apparatus 10 of FIG. 1, the data storage apparatus 2200 of FIG. 9, the data storage apparatus 3200 of FIG. 11, or the data storage apparatus 4200 of FIG. 12.

Figure 14:
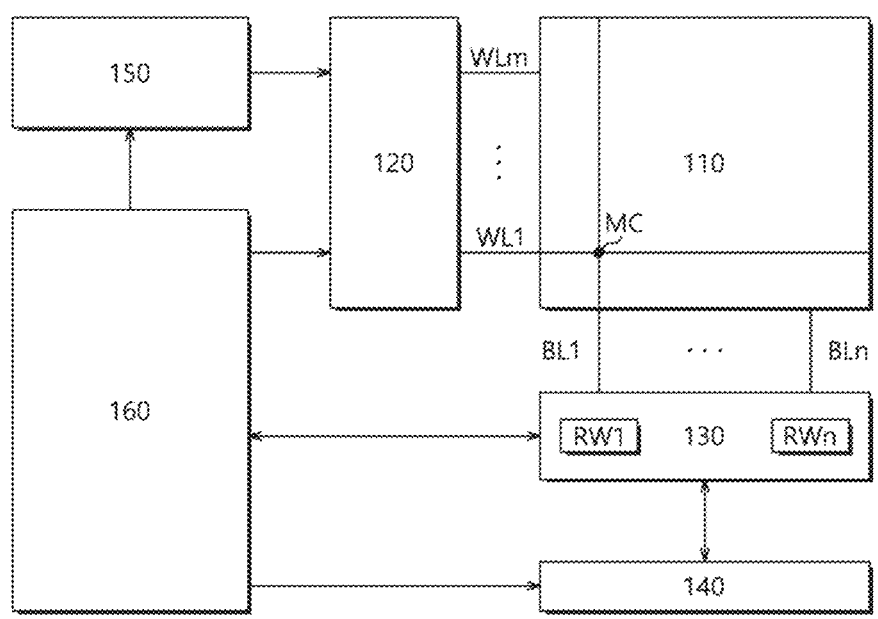
FIG. 14 is a block diagram illustrating a nonvolatile memory device included in a data storage apparatus in accordance with an embodiment of the present disclosure.

FIG. 14 is a block diagram illustrating a nonvolatile memory device 100 included in a data storage apparatus in accordance with an embodiment. Referring to FIG. 14, the nonvolatile memory device 100 may include a memory cell array 110, a row decoder 120, a column decoder 140, a data read and write (read/write) block 130, a voltage generator 150, and a control logic 160.

The memory cell array 110 may include memory cells MC arranged in regions in which word lines WL1 to WLm and bit lines BL1 to BLn cross to each other.

The row decoder 120 may be coupled to the memory cell array 110 through the word lines WL1 to WLm. The row decoder 120 may operate through control of the control logic 160. The row decoder 120 may decode an address provided from an external apparatus (not shown). The row decoder 120 may select and drive the word lines WL1 to WLm based on a decoding result. For example, the row decoder 120 may provide a word line voltage provided from the voltage generator 150 to the word lines WL1 to WLm.

The data read/write block 130 may be coupled to the memory cell array 110 through the bit lines BL1 to BLn. The data read/write block 130 may include read/write circuits RW1 to RWn corresponding to the bit lines BL1 to BLn. The data read/write block 130 may operate according to control of the control logic 160. The data read/write block 130 may operate as a write driver or a sense amplifier according to an operation mode. For example, the data read/write block 130 may operate as the write driver configured to store data provided from an external apparatus in the memory cell array 110 in a write operation. In another example, the data read/write block 130 may operate as the sense amplifier configured to read data from the memory cell array 110 in a read operation.

The column decoder 140 may operate though control of the control logic 160. The column decoder 140 may decode an address provided from an external apparatus (not shown). The column decoder 140 may couple the read/write circuits RW1 to RWn of the data read/write block 130 corresponding to the bit lines BL1 to BLn and data input/output (I/O) lines (or data I/O buffers) based on a decoding result.

The voltage generator 150 may generate voltages used for an internal operation of the nonvolatile memory device 100. The voltages generated through the voltage generator 150 may be applied to the memory cells of the memory cell array 110. For example, a program voltage generated in a program operation may be applied to word lines of memory cells in which the program operation is to be performed. In another example, an erase voltage generated in an erase operation may be applied to well regions of memory cells in which the erase operation is to be performed. In another example, a read voltage generated in a read operation may be applied to word lines of memory cells in which the read operation to be performed.

The control logic 160 may control an overall operation of the nonvolatile memory device 100 based on a control signal provided from an external apparatus. For example, the control logic 160 may control an operation of the nonvolatile memory device 100 such as a read operation, a write operation, an erase operation of the nonvolatile memory device 100.

The above described embodiments of the present invention are intended to illustrate and not to limit the present invention. Various alternatives and equivalents are possible. The invention is not limited by the embodiments described herein. Nor is the invention limited to any specific type of semiconductor device. Other additions, subtractions, or modifications are obvious in view of the present disclosure and are intended to fall within the scope of the appended claims.

What is claimed is:

1. A data storage apparatus comprising:
   a nonvolatile memory device including a first memory region and a second memory region; and
   a controller configured to control a write operation of the nonvolatile memory device,
   wherein the controller includes:
   a memory configured to store at least one or more write requests and address information for the write requests received from a host apparatus; and
   a processor configured to collect address information corresponding to a preset sampling range among the address information as a first sampling address, determine continuity between the collected address information of the first sampling address, and control the nonvolatile memory device to store data corresponding to all or a portion of the write requests for the address information of the first sampling address in the first memory region based on a determination result.

2. The data storage apparatus of claim 1, wherein the first memory region is a first memory block which includes memory cells which store data in a single level cell (SLC) manner.

3. The data storage apparatus of claim 1, wherein the second memory region is a second memory block which includes memory cells which store data in a multilevel cell (MLC) manner.

4. The data storage apparatus of claim 3, wherein the MLC manner is a method for storing one of 2 bits of data, 3 bits of data, and 4 bits of data in one memory cell.

5. The data storage apparatus of claim 1, wherein the preset sampling range is corresponding to a size of data to be stored through one write operation.

6. The data storage apparatus of claim 1, wherein each of the address information includes a start logical block address and an address length.

7. The data storage apparatus of claim 1, wherein a flash translation layer (FTL) is loaded into the memory and the FTL includes a write mode determination module.

8. The data storage apparatus of claim 7, wherein the processor, by driving the write mode determination module, collects the first sampling address, determines the continuity between the address information of the first sampling address, and determines whether or not the address information of the first sampling address are sequential based on the determination result.

9. The data storage apparatus of claim 7, wherein, when the address information of the first sampling address are not sequential, the processor, by driving the write mode determination module, collects next address information corresponding to a size of non-sequential address information of the first sampling address and determines whether or not sequential address information of the first sampling address and the collected next address information are sequential by determining the continuity between the sequential address information of the first sampling address and the collected next address information.

10. The data storage apparatus of claim 9, wherein, when the sequential address information of the first sampling address and the collected next address information are sequential, the processor controls the nonvolatile memory device to store data corresponding to write requests for the sequential address information of the first sampling address and the collected next address information in the first memory block and store data corresponding to write requests for the non-sequential address information of the first sampling address in the second memory block.

11. The data storage apparatus of claim 9, wherein, when the sequential address information of the first sampling address and the collected next address information are not sequential, the processor controls the nonvolatile memory device to store the data corresponding to the write requests for the address information of the first sampling address in the first memory block, and the processor, by driving the write mode determination module, collects address information after the first sampling address according to the preset sampling range as a second sampling address, determines continuity between the address information of the second sampling address, and determines whether or not the address information of the second sampling address are sequential based on a determination result.

12. An operating method of a data storage apparatus which includes a nonvolatile memory device including a first memory region and a second memory region; and a controller including a memory configured to store at least one or more write requests and address information for the write requests, the method comprising:
  collecting address information corresponding to a preset sampling range among the address information as a first sampling address;
  determining continuity between the collected address information of the first sampling address; and
  storing data corresponding to all or a portion of the write requests for the address information of the first sampling address in the first memory region based on a determination result.

13. The method of claim 12, wherein each of the address information includes a start logical block address and an address length, and
  the determining of the continuity between the collected address information of the first sampling address includes determining whether or not the collected address information of the first sampling address are sequential by comparing a sum of the start logical block address and the address length of each address information and the start logical block address of next address information.

14. The method of claim 13, wherein the storing of the data in the first memory region includes storing the data corresponding to the write requests for the address information of the first sampling address in the first memory region when the address information of the first sampling address are sequential according to a comparison result.

15. The method of claim 13, wherein when the address information of the first sampling address are not sequential according to the comparison result, the storing of data in the first memory region further includes:
  collecting next address information corresponding to a size of non-sequential address information of the first sampling address; and
  determining whether or not the sequential address information of the first sampling address and the collected next address information are sequential by determining the continuity between the sequential address information of the first sampling address and the collected next address information.

16. The method of claim 15, further comprising:
  storing data corresponding to write requests for the sequential address information of the first sampling address and the collected next address information in the first memory region and storing data corresponding to write requests for the non-sequential address information of the first sampling address in the second memory region when the sequential address information of the first sampling address and the collected next address information are sequential; and
  storing the data corresponding to the write requests for the address information of the first sampling address in the first memory region, collecting address information after the first sampling address according to the preset sampling range as a second sampling address, determining continuity between the address information of the second sampling address, and determining whether or not the address information of the second sampling address are sequential based on a determination result when the sequential address information of the first sampling address and the collected next address information are not sequential.

17. The method of claim 12, wherein the first memory region is a first memory block which includes memory cells configured to store data in a single level cell (SLC) manner and the second memory region is a second memory block which includes memory cells configured to store data in a multilevel cell (MLC) manner, wherein the MLC manner is a method of storing one of 2 bits of data, 3 bits of data, and 4 bits of data.

18. The method of claim 12, wherein the preset sampling range is corresponding to a size of data to be stored through one write operation.

19. A data storage device comprising:
a memory device including a first memory region and a second memory region, a write speed of the first memory region faster than that of the second memory region; and
a controller suitable for:
receiving a plurality of data including a first group of data in a first range and a second group of data in a second range next to the first range;
determining whether a first data among the second group of data is sequential to sequential data among the first group of data;
when the first data is sequential to the sequential data, controlling the memory device to store the sequential data and the first data in the first memory region; and
when the first data is not sequential to the sequential data, controlling the memory device to store the sequential data in the first memory region, and store the first data in the second memory region.

20. The data storage apparatus of claim 19, wherein the first memory region includes memory cells of a single level cell (SLC) and the second memory region includes memory cells of a multiple level cell (MLC).

* * * * *